United States Patent
Sonoda et al.

(10) Patent No.: US 10,468,467 B2
(45) Date of Patent: Nov. 5, 2019

(54) ORGANIC ELECTROLUMINESCENCE DISPLAY DEVICE

(71) Applicant: Sharp Kabushiki Kaisha, Sakai, Osaka (JP)

(72) Inventors: Tohru Sonoda, Sakai (JP); Takeshi Hirase, Sakai (JP); Tohru Senoo, Sakai (JP); Takashi Ochi, Sakai (JP); Mamoru Ishida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/084,279

(22) PCT Filed: Mar. 8, 2017

(86) PCT No.: PCT/JP2017/009285
§ 371 (c)(1),
(2) Date: Sep. 12, 2018

(87) PCT Pub. No.: WO2017/159503
PCT Pub. Date: Sep. 21, 2017

(65) Prior Publication Data
US 2019/0081110 A1    Mar. 14, 2019

(30) Foreign Application Priority Data
Mar. 15, 2016 (JP) ................. 2016-051362

(51) Int. Cl.
*H01L 27/32*    (2006.01)
*H01L 51/00*    (2006.01)
(Continued)

(52) U.S. Cl.
CPC ........ *H01L 27/323* (2013.01); *H01L 51/0097* (2013.01); *H01L 51/5012* (2013.01);
(Continued)

(58) Field of Classification Search
CPC combination set(s) only.
See application file for complete search history.

(56) References Cited

U.S. PATENT DOCUMENTS

2003/0071567 A1    4/2003    Eida et al.
2003/0214612 A1*    11/2003    Freeman ........... G02F 1/133308
                                                         349/12

(Continued)

FOREIGN PATENT DOCUMENTS

JP      50-50054 A    5/1975
JP      07-272857 A    10/1995
(Continued)

OTHER PUBLICATIONS

Official Communication issued in International Patent Application No. PCT/JP2017/009285, dated May 23, 2017.

*Primary Examiner* — Mamadou L Diallo
(74) *Attorney, Agent, or Firm* — Keating & Bennett, LLP

(57) ABSTRACT

Provided is an organic EL display device including an organic EL display panel exhibiting flexibility, a functional layer portion provided to face the organic EL display panel on one surface side thereof and exhibiting flexibility, and a support layer portion provided to face the organic EL display panel on the other surface side thereof and exhibiting flexibility. The functional layer portion is slidably provided on one surface of the organic EL display panel, and the support layer portion is slidably provided on the other surface of the organic EL display panel.

15 Claims, 11 Drawing Sheets

(51) Int. Cl.
*H01L 51/50* (2006.01)
*H01L 51/52* (2006.01)

(52) U.S. Cl.
CPC ........ *H01L 51/525* (2013.01); *H01L 51/5246* (2013.01); *H01L 51/5281* (2013.01)

(56) References Cited

U.S. PATENT DOCUMENTS

| | | |
|---|---|---|
| 2004/0183958 A1 | 9/2004 | Akiyama et al. |
| 2005/0263775 A1 | 12/2005 | Ikeda et al. |
| 2013/0093315 A1 | 4/2013 | Boerner et al. |
| 2015/0008414 A1* | 1/2015 | Isobe .................. H01L 51/5228 257/40 |
| 2015/0076464 A1 | 3/2015 | Sakaguchi |
| 2017/0005295 A1* | 1/2017 | Takeda ................ H01L 51/0031 |

FOREIGN PATENT DOCUMENTS

| | | |
|---|---|---|
| JP | 2003-347041 A | 12/2003 |
| JP | 2004-279867 A | 10/2004 |
| JP | 2005-526296 A | 9/2005 |
| JP | 2006-004917 A | 1/2006 |
| JP | 2013-533587 A | 8/2013 |
| KR | 10-2010-0018426 A | 2/2010 |
| WO | 02/17689 A1 | 2/2002 |
| WO | 2013/146583 A1 | 10/2013 |

* cited by examiner

45b(55b)

45c(55c)

ORGANIC ELECTROLUMINESCENCE DISPLAY DEVICE

TECHNICAL FIELD

The present invention relates to an organic EL display device.

BACKGROUND ART

In recent years, a light-emitting organic electroluminescence (EL) display device using an organic EL element has attracted attention as a display device as an alternative to a liquid crystal display device.

For example, Patent Document 1 discloses a light emitting panel (an organic EL display panel) configured such that for improving the light emission efficiency of the light emitting panel, a space with a predetermined refractive index is formed in such a manner that spacers are interposed between a common transparent electrode of a cathode electrode provided on a first substrate and a second substrate provided to face the common transparent electrode.

CITATION LIST

Patent Document

PATENT DOCUMENT 1: Japanese Unexamined Patent Publication No. 2003-347041

SUMMARY OF THE INVENTION

Technical Problem

For the organic EL display device, a multilayer structure in which the organic EL element, various films, etc. are stacked on a resin substrate exhibiting flexibility has been employed, and a repeatedly-bendable organic EL display device has been proposed. In this bendable organic EL display device, when a device body is bent, bending stress is generated, and a smaller curvature radius upon bending results in greater distortion due to bending stress of each layer forming the multilayer structure. In this case, distortion of each layer (due to bending stress) depends on a distance from a neutral surface set by the Young's modulus, film thickness, and stacked position of each layer to each layer. Distortion of a layer farther from the neutral surface is relatively greater, and distortion of a layer closer to the neutral surface is relatively smaller. When distortion exceeds a limit value at a certain layer, film rupturing or irreversible deformation occurs. Further, in the organic EL display device, the functions thereof are enhanced by a hard coating layer, a touch panel, etc. provided on a surface of the organic EL display device. Thus, the entire thickness of the device increases. For this reason, a distance between a device surface layer and the neutral surface increases, and great distortion of the device surface easily occurs. Accordingly, film rupturing or irreversible deformation as described above easily occurs, and the displaying quality or reliability of the organic EL display device is lowered.

The present invention has been made in view of the above-described points, and is intended to reduce film rupturing and irreversible deformation at each layer of an organic EL display device.

Solution to the Problem

For accomplishing the above-described object, the organic EL display device according to the present invention includes an organic EL display panel exhibiting flexibility, a functional layer portion provided to face the organic EL display panel on one surface side thereof and exhibiting flexibility, and a support layer portion provided to face the organic EL display panel on the other surface side thereof and exhibiting flexibility. The functional layer portion is slidably provided on one surface of the organic EL display panel, and the support layer portion is slidably provided on the other surface of the organic EL display panel.

Advantages of the Invention

According to the present invention, the functional layer portion is slidably provided on one surface of the organic EL display panel, and the support layer portion is slidably provided on the other surface of the organic EL display panel. Thus, film rupturing and irreversible deformation at each layer of the organic EL display device can be reduced.

DESCRIPTION OF EMBODIMENTS

Hereinafter, embodiments of the present invention will be described in detail with reference to the drawings. Note that the present invention is not limited to each of the embodiments below.

First Embodiment

Figure 1:
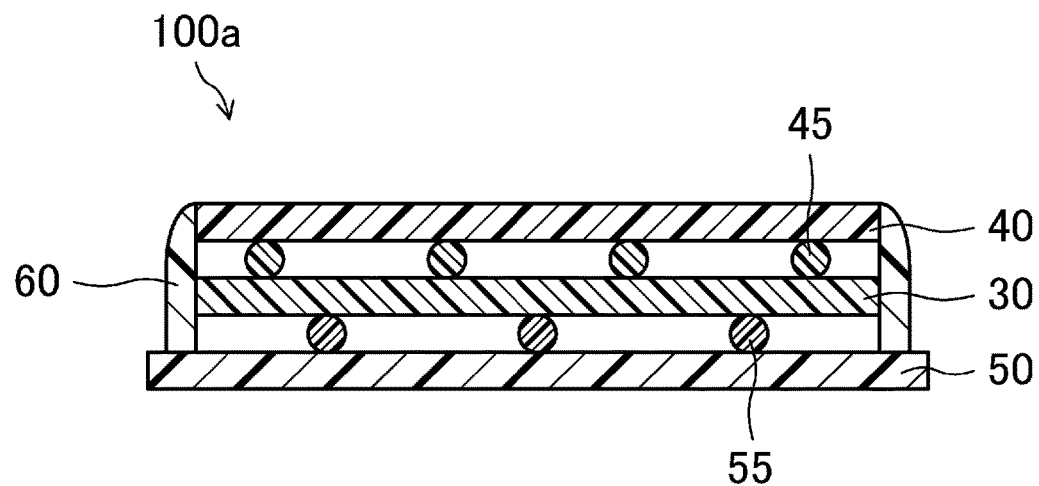
FIG. 1 is a sectional view of an outline configuration of an organic EL display device according to a first embodiment of the present invention in a flat state.
Figure 2:
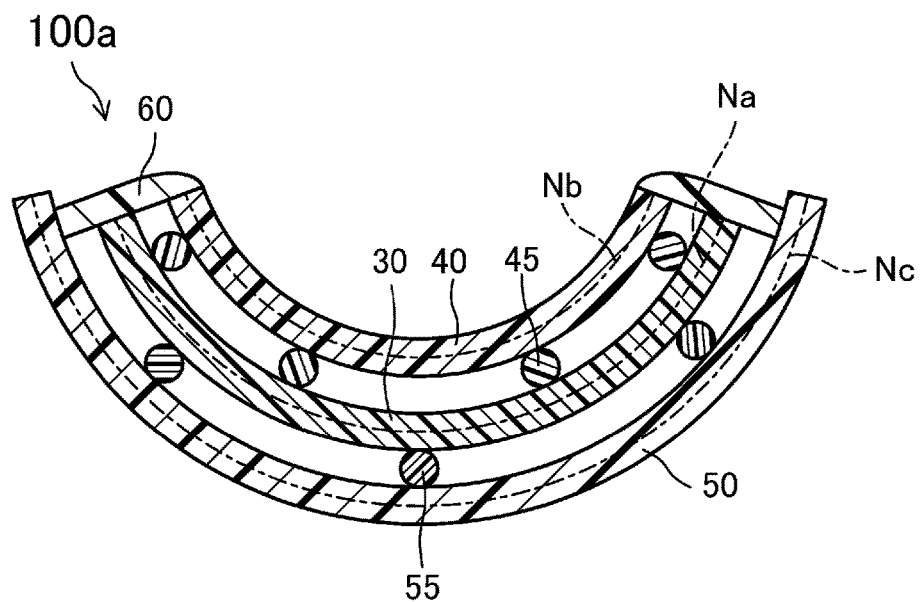
FIG. 2 is a sectional view of an outline configuration of the organic EL display device according to the first embodiment of the present invention in a bent state.
Figure 3:
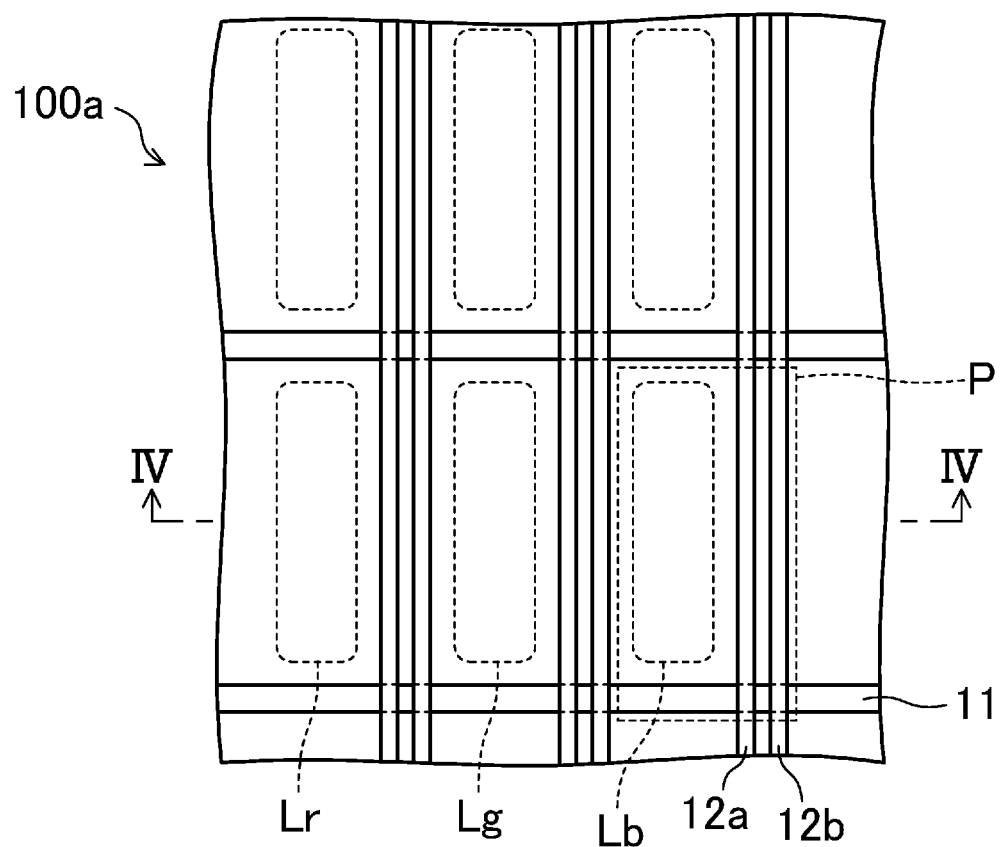
FIG. 3 is a plan view of a pixel structure of the organic EL display device according to the first embodiment of the present invention.
Figure 4:
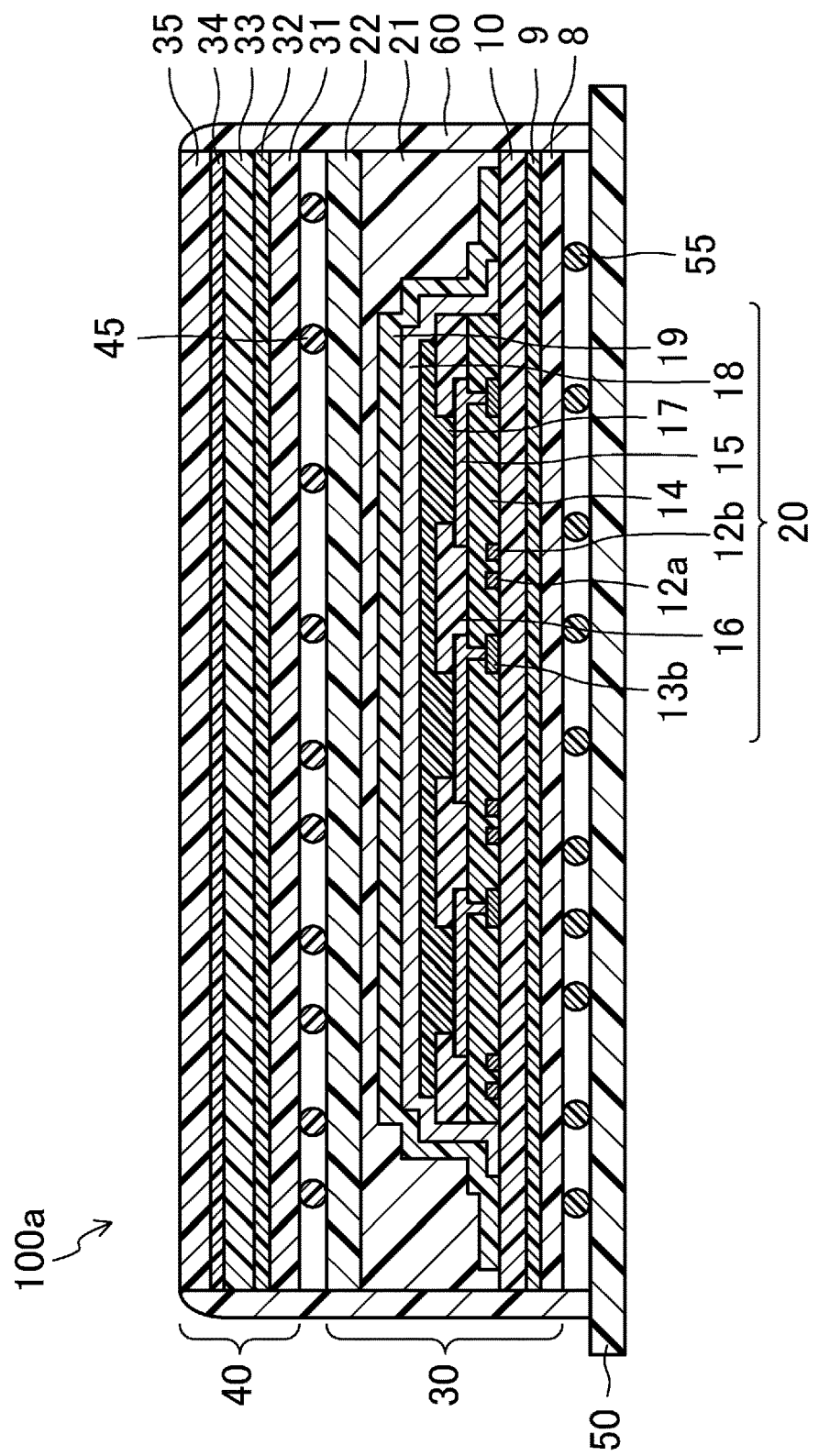
FIG. 4 is a sectional view of a detailed configuration of the organic EL display device along an IV-IV line of FIG. 3.
Figure 5:
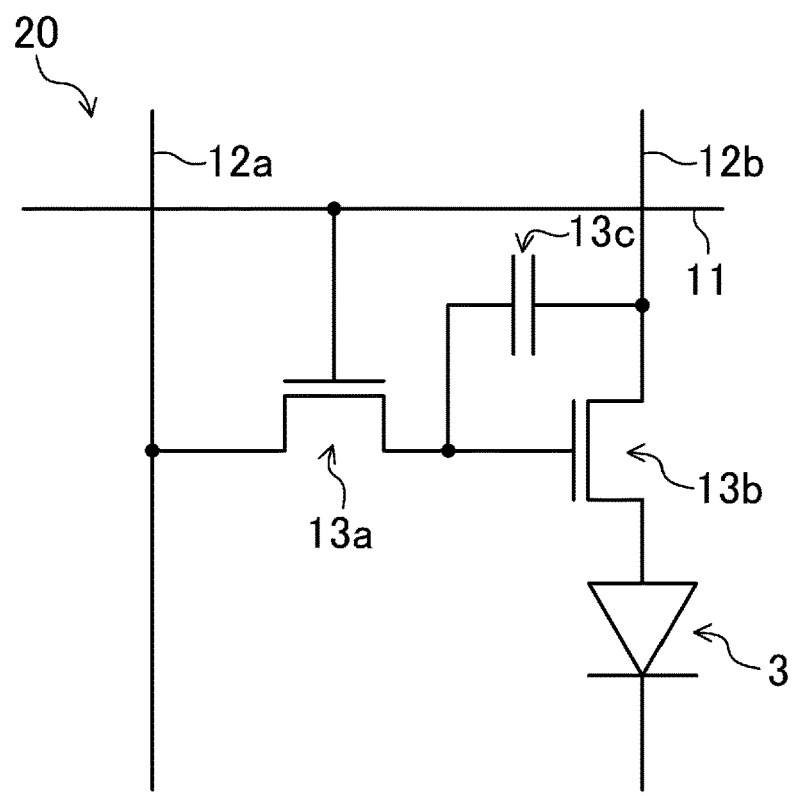
FIG. 5 is an equivalent circuit diagram of an organic EL element layer forming the organic EL display device according to the first embodiment of the present invention.
Figure 6:
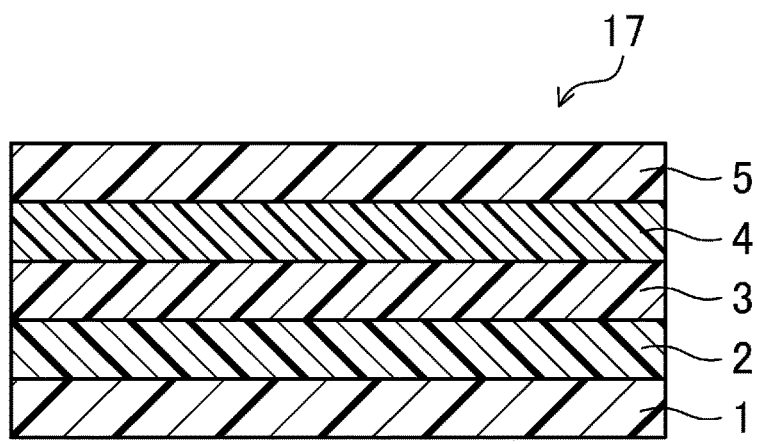
FIG. 6 is a sectional view of an organic EL layer forming the organic EL display device according to the first embodiment of the present invention.

FIGS. 1 to 10 illustrate a first embodiment of an organic EL display device according to the present invention. In this embodiment, FIG. 1 is a sectional view of an outline configuration an organic EL display device 100a of the present embodiment in a flat state. Moreover, FIG. 2 is a sectional view of the outline configuration of the organic EL display device 100a in a bent state. Further, FIG. 3 is a plan view of a pixel structure of the organic EL display device 100a. In addition, FIG. 4 is a sectional view of a detailed configuration of the organic EL display device 100a along an IV-IV line of FIG. 3. Moreover, FIG. 5 is an equivalent circuit diagram of an organic EL element layer 20 forming the organic EL display device 100a. Further, FIG. 6 is a sectional view of an organic EL layer 17 forming the organic EL display device 100a.

As illustrated in FIGS. 1, 2, and 4, the organic EL display device 100a includes an organic EL display panel 30, a functional layer portion 40, and a support layer portion 50 facing each other. The organic EL display device 100a has such a structure that the organic EL display panel 30, the functional layer portion 40, and the support layer portion 50 are integrated by a frame-shaped seal member 60 provided at peripheral end portions of the organic EL display panel 30, the functional layer portion 40, and the support layer portion 50. In this embodiment, in the organic EL display device 100a, multiple sub-pixels P are arranged in a matrix in a display region (not shown) for image displaying as illustrated in FIG. 3. Moreover, in the display region of the organic EL display device 100a, the sub-pixels P each having red light emission regions Lr for displaying with a red gradation, the sub-pixels P each having green light emission regions Lg for displaying with a green gradation, and the sub-pixels P each having blue light emission regions Lb for displaying with a blue gradation are provided adjacent to each other as illustrated in FIG. 3. Note that in the display region of the organic EL display device 100a, adjacent three sub-pixels P having the red light emission region Lr, the green light emission region Lg, and the blue light emission region Lb form a single pixel.

As illustrated in FIG. 4, the organic EL display panel 30 includes a base resin substrate layer 10, a stress adjustment layer 8 provided below the base resin substrate layer 10 as viewed in the figure, the organic EL element layer 20 provided above the base resin substrate layer 10 as viewed in the figure, and an opposing resin substrate layer 22 provided above the organic EL element layer 20 as viewed in the figure. The organic EL display panel 30 exhibits flexibility. In this embodiment, a first adhesive layer 9 formed from a light curing adhesive sheet, an UV curing adhesive, a thermosetting adhesive, an epoxy-based adhesive, or a cyanoacrylate-based instant adhesive is provided between the base resin substrate layer 10 and the stress adjustment layer 8. Moreover, a second adhesive layer 21 formed from an UV retardation curing adhesive, a thermosetting adhesive, an epoxy-based adhesive, an acrylic-based adhesive, or a polyolefin-based adhesive is provided between the organic EL element layer 20 and the opposing resin substrate layer 22.

The stress adjustment layer 8 is configured to control the position of a first neutral surface Na (see FIG. 2) for bending stress in the organic EL display panel 30. In this embodiment, the stress adjustment layer 8 is, for example, formed from a plastic film such as polyethylene terephthalate, polyethylene naphthalate, aramid, (meth)acrylate, or triacetylcellulose. Note that the first neutral surface Na is a surface which receives no compression and tension and at which no bending stress is substantially caused when the organic EL display panel 30 is bent.

The base resin substrate layer 10 is, for example, formed from a plastic film such as polyimide.

The organic EL element layer 20 is configured such that the following first to fifth multilayer structures are provided.

As illustrated in FIG. 3, the organic EL element layer 20 includes, as the first multilayer structure, multiple gate lines 11 provided to extend in parallel with each other in a lateral direction as viewed in the figure on the base resin substrate layer 10, multiple source lines 12a provided to extend in parallel with each other in a longitudinal direction as viewed in the figure, and multiple power source lines 12b each provided adjacent to the source lines 12a and provided to extend in parallel with each other. Note that a moistureproof layer including a single-layer film or a multilayer film such as a silicon nitride film, a silicon oxide film, or a silicon oxynitride film is provided between the base resin substrate layer 10 and a gate layer such as each gate line 11.

As illustrated in FIG. 5, the organic EL element layer 20 includes, as the second multilayer structure, multiple first TFTs 13a each provided at the sub-pixels P, multiple second TFTs 13b each provided at the sub-pixels P, and multiple capacitors 13c each provided at the sub-pixels P. In this embodiment, the first TFT 13a is connected to the corresponding gate line 11 and the corresponding source line 12a as illustrated in FIG. 5. Moreover, as illustrated in FIG. 5, the second TFT 13b is connected to the corresponding first TFT 13a and the corresponding power source line 12b. Further, each of the first TFT 13a and the second TFT 13b includes, for example, a gate electrode provided on the base resin substrate layer 10 through the moistureproof layer, a gate insulating film provided to cover the gate electrode, a semiconductor layer provided on the gate insulating film to overlap with the gate electrode, and source and drain electrodes provided to face each other on the semiconductor layer. In addition, as illustrated in FIG. 5, the capacitor 13c is connected to the corresponding first TFT 13a and the corresponding power source line 12b. Moreover, the capacitor 13c includes, for example, one electrode made of the same material as that of the gate line 11 at the same layer as that of the gate line 11, the other electrode made of the same material as that of the source line 12a at the same layer as that of the source line 12a, and a gate insulating film provided between these electrodes in a pair. Note that in the present embodiment, the bottom-gate first TFT 13a and the bottom-gate second TFT 13b have been described by way of example, but the first TFT 13a and the second TFT 13b may be top-gate TFTs.

As illustrated in FIG. 4, the organic EL element layer 20 includes, as the third multilayer structure, an interlayer insulating film 14 provided to substantially cover each first TFT 13a (see FIG. 5), each second TFT 13b, and each capacitor 13c (see FIG. 5), and multiple first electrodes 15 each provided as anodes at the sub-pixels P on the interlayer insulating film 14 and each connected to the corresponding second TFTs 13b. In this embodiment, the interlayer insulating film 14 is, as illustrated in FIG. 4, provided to cover other portions of each second TFT 13b than part of the drain electrode. Note that the interlayer insulating film 14 is, for example, formed from light-sensitive acrylic resin, light-sensitive polyimide resin, or light-sensitive polysiloxane resin. Moreover, the multiple first electrodes 15 are, in a matrix, provided corresponding to the multiple sub-pixels P on the interlayer insulating film 14. Further, as illustrated in FIG. 4, the first electrode 15 is, at each sub-pixel P, connected to the drain electrode of the second TFT 13b through a contact hole formed at the interlayer insulating film 14. In addition, the first electrode 15 has the function of injecting hole (electron holes) to the later-described organic EL layer 17. Moreover, the first electrode 15 is more preferably made of a material with a greater work function for improving the efficiency for injecting electron holes to the organic EL layer 17. Note that the material forming the first electrode 15 includes, for example, metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), and ytterbium (Yb). Further, the material forming the first electrodes 15 may include, for example, alloys such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al). In addition, the material forming the first electrode 15 may include, for example, conductive oxides such as tin oxide (SnO), zinc oxide (ZnO), indium tin oxide (ITO), and indium zinc oxide (IZO). Moreover, the first electrode 15 may be, for example, formed from a stack of multiple layers made of the above-described materials, such as ITO/Ag, IZO/Ag, or IZO/Al. Note that among the conductive oxides etc., the materials with a great work function include, for example, indium tin oxide (ITO) and indium zinc oxide (IZO).

As illustrated in FIG. 4, the organic EL element layer 20 includes, as the fourth multilayer structure, an edge cover 16 provided in a grid pattern to cover an edge portion of each first electrode 15, and the organic EL layer 17 provided to cover the first electrodes 15 exposed through the edge cover 16. In this embodiment, a material forming the edge cover 16 includes, for example, inorganic films such as silicon oxide ($SiO_2$), silicon nitride (SiNx (x is a positive number)) including trisilicon tetranitride ($Si_3N_4$) etc., and silicon oxynitride (SiNO), and organic films such as (light-sensitive) polyimide resin, (light-sensitive) acrylic resin, (light-sensitive) polysiloxane resin, and novolac resin. Moreover, as illustrated in FIG. 6, the organic EL layer 17 includes an electron hole injection layer 1, an electron hole transport layer 2, a light emission layer 3, an electron transport layer 4, and an electron injection layer 5, which are provided over the associated first electrode 15 in this order.

The electron hole injection layer 1 is also called an anode buffer layer, and has the function of bringing the energy levels of the first electrode 15 and the organic EL layer 17 close to each other to improve the efficiency for injecting electron holes from the first electrode 15 to the organic EL layer 17. In this embodiment, a material forming the electron hole injection layer 1 includes, for example, a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The electron hole transport layer 2 has the function of improving the efficiency for transporting electron holes from the first electrode 15 to the organic EL layer 17. In this embodiment, a material forming the electron hole transport layer 2 includes, for example, a porphyrin derivative, an aromatic tertiary amine compound, a styrylamine derivative, polyvinyl carbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light emission layer 3 is a region where electron holes and electrons are respectively injected from the first electrodes 15 and a later-described second electrode 18 to the region when voltage is applied by the first electrodes 15 and the second electrode 18 and are joined again. In this embodiment, the light emission layer 3 is made of a material with high light emission efficiency. The material forming the light emission layer 3 includes, for example, a metal oxinoid compound [a 8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a tristyrylbenzene derivative, a perylene derivative, a perinone derivative, an aminopyrene derivative, a pyridine derivative, a rhodamine derivative, an acridine derivative, phenoxazon, a quinacridone derivative, rubrene, poly-p-phenylene vinylene, and polysilane.

The electron transport layer 4 has the function of moving electrons to the light emission layer 3 with favorable efficiency. In this embodiment, a material forming the electron transport layer 4 includes, for example, organic compounds such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 has the function of bringing the energy levels of the second electrode 18 and the organic EL layer 17 close to each other to improve the efficiency for injecting electrons from the second electrode 18 to the organic EL layer 17. By this function, the drive voltage of the organic EL element layer 20 can be lowered. Note that the electron injection layer 5 is also called a cathode buffer layer. In this embodiment, a material forming the electron injection layer 5 includes, for example, inorganic alkali compounds such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 4, the organic EL element layer 20 includes, as the fifth multilayer structure, the second electrode 18 provided as a cathode to cover the organic EL layer 17 and the edge cover 16, and a sealing film 19 provided to cover the second electrode 18. In this embodiment, the second electrode 18 has the function of injecting electrons to the organic EL layer 17. Moreover, the second electrode 18 is more preferably made of a material with a smaller work function for improving the efficiency for injecting electrons to the organic EL layer 17. Note that the material forming the second electrode 18 includes, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), and ytterbium (Yb). Moreover, the second electrode 18 may be, for example, made of alloys such as magnesium (Mg)/copper (Cu), magnesium (Mg)/silver (Ag), sodium (Na)/potassium (K), astatine (At)/astatine oxide (AtO$_2$), lithium (Li)/aluminum (Al), lithium (Li)/calcium (Ca)/aluminum (Al), and lithium fluoride (LiF)/calcium (Ca)/aluminum (Al). Further, the second electrode 18 may be, for example, made of conductive oxides such as tin oxide (SnO), zinc oxide (ZnO), indium tin oxide (ITO), and indium zinc oxide (IZO). In addition, the second electrode 18 may be, for example, formed from a stack of multiple layers made of the above-described materials, such as ITO/Ag. Note that the material with a small work function includes, for example, magnesium (Mg), lithium (Li), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al). The sealing film 19 has the function of protecting the organic EL layer 17 from moisture and oxygen. Note that a material forming the sealing film 19 includes, for example, inorganic materials such as silicon oxide (SiO$_2$), aluminum oxide (Al$_2$O$_3$), and silicon nitride (SiNx (x is a positive number)) including trisilicon tetranitride (Si$_3$N$_4$) etc., an organic-inorganic composite material such as silicon carbonitride (SiCN), and organic materials such as acrylate, polyuria, parylene, polyimide, and polyamide.

The opposing resin substrate layer 22 is, for example, formed from a plastic film such as polyimide, polyethylene terephthalate, polyethylene naphthalate, aramid, or (meth) acrylate.

As illustrated in FIGS. 1, 2, and 4, the functional layer portion 40 is slidably provided on one surface (the upper side as viewed in the figure) of the organic EL display panel 30. Moreover, as illustrated in FIG. 4, the functional layer portion 40 includes a polarization plate 31, a touch panel 33 provided on the polarization plate 31 through a third adhesive layer 32, and a hard coating layer 35 provided on the touch panel 33 through a fourth adhesive layer 34. The functional layer portion 40 exhibits flexibility. In this embodiment, multiple first spacers 45 movable on each surface of the organic EL display panel 30 and the functional layer portion 40 are randomly provided between the organic EL display panel 30 and the functional layer portion 40.

The polarization plate 31 includes, for example, a polarizer layer obtained in such a manner that a polyvinyl alcohol film to which iodine is adsorbed is uniaxially stretched, and a pair of protection films sandwiching the polarizer layer.

The third adhesive layer 32 and the fourth adhesive layer 34 are, for example, formed from a light curing adhesive sheet, an UV curing adhesive, a thermosetting adhesive, an epoxy-based adhesive, or a cyanoacrylate-based instant adhesive.

The touch panel 33 includes, for example, a base film made of polyimide, polyethylene terephthalate, polyethylene naphthalate, aramid, or (meth)acrylate, and a capacitance touch panel layer provided on the base film.

The hard coating layer 35 includes, for example, a base material layer made of polyimide, polyethylene terephthalate, polyethylene naphthalate, aramid, or (meth)acrylate, and a surface layer provided on the base material layer and made of UV curing organosilicon resin, thermosetting resin, acrylic resin, urethane resin, or polysiloxane resin.

As illustrated in FIGS. 1, 2, and 4, the support layer portion 50 is slidably provided on the other surface (the lower side as viewed in the figure) of the organic EL display panel 30. Moreover, the support layer portion 50 is, for example, formed from a plastic substrate of polyimide etc. or a thin plate made of iron, magnesium, etc., and exhibits flexibility. In this embodiment, multiple second spacers 55 movable on each surface of the organic EL display panel 30 and the support layer portion 50 are randomly provided between the organic EL display panel 30 and the support layer portion 50.

Figure 7:
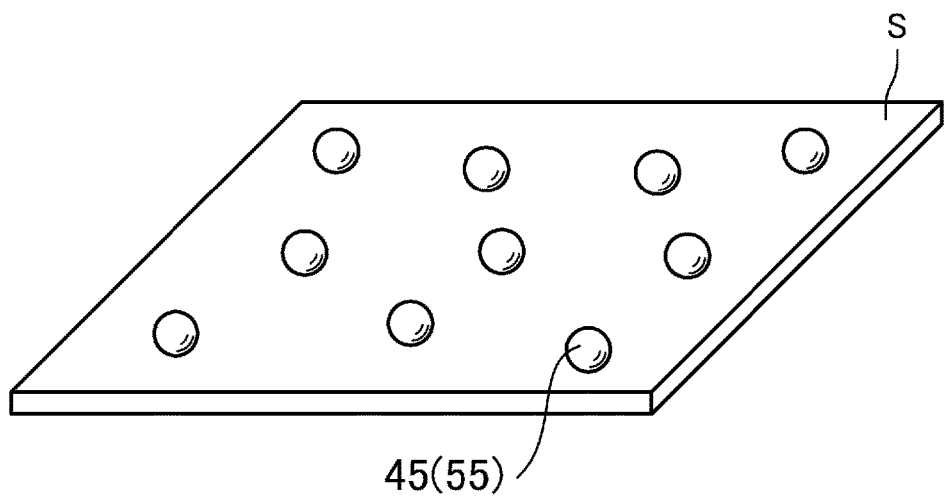
FIG. 7 is a first perspective view of spacers forming the organic EL display device according to the first embodiment of the present invention.
Figure 8:
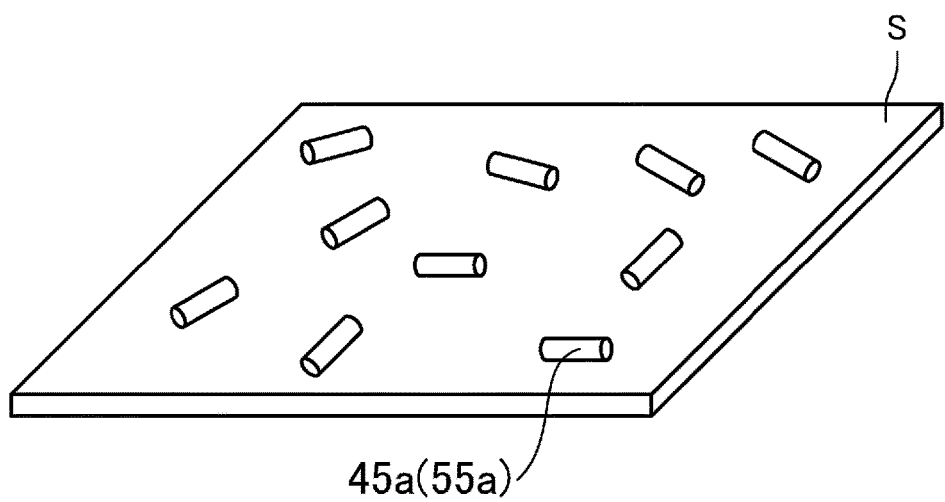
FIG. 8 is a second perspective view of the spacers forming the organic EL display device according to the first embodiment of the present invention.
Figure 9:
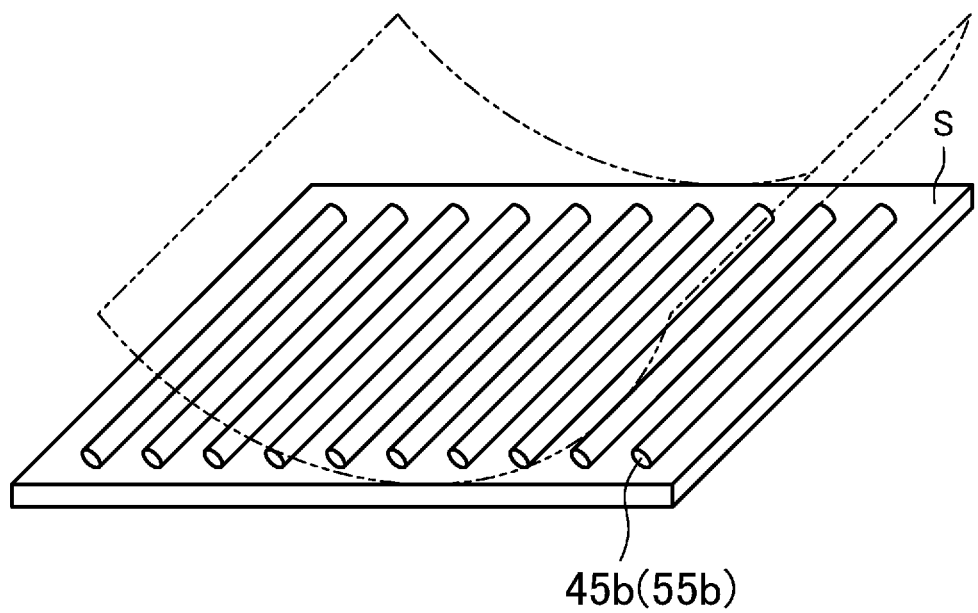
FIG. 9 is a third perspective view of the spacers forming the organic EL display device according to the first embodiment of the present invention.
Figure 10:
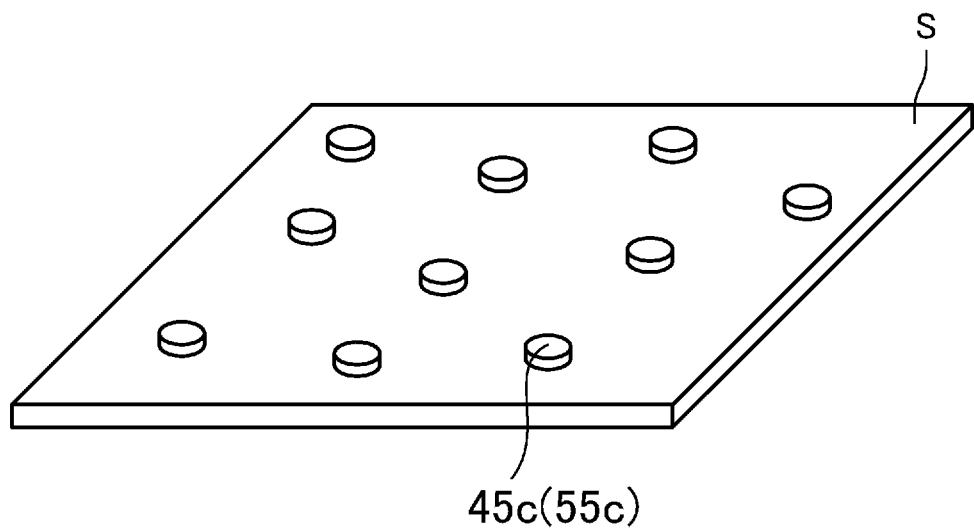
FIG. 10 is a fourth perspective view of the spacers forming the organic EL display device according to the first embodiment of the present invention.

As illustrated in FIG. 7, the first spacers 45 and the second spacers 55 are, for example, formed from Micropearl (registered trademark) series plastic beads manufactured by Sekisui Chemical Co., Ltd. and having a diameter of about 5 µm. In this embodiment, FIG. 7 is a first perspective view of a state when the first spacers 45 (the second spacers 55) forming the organic EL display device 100a are arranged on both surfaces S of the organic EL display panel 30, the functional layer portion 40, and the support layer portion 50. Note that in the present embodiment, the spherical first spacers 45 (the spherical second spacers 55) movable (rollable) on each surface S of the organic EL display panel 30 and the functional layer portion 40 (the organic EL display panel 30 and the support layer portion 50) have been described by way of example, but at least one of the first spacer 45 or the second spacer 55 may be first spacers 45a to 45c (second spacers 55a to 55c) illustrated in FIGS. 8 to 10. In this embodiment, FIGS. 8 to 10 are second to fourth perspective views of a state when the first spacers 45a to 45c (the second spacers 55a to 55c) as variations of the first spacer 45 (the second spacer 55) are arranged on the surface S. Specifically, as illustrated in FIG. 8, each first spacer 45a (each second spacer 55a) is formed as a relatively-short rod-shaped columnar body movable (rollable) on both surfaces S of the organic EL display panel 30 and the functional layer portion 40 (the organic EL display panel 30 and the support layer portion 50). Moreover, as illustrated in FIG. 9, each first spacer 45b (each second spacer 55b) is formed as a relatively-long rod-shaped columnar body movable (rollable) on both surfaces S of the organic EL display panel 30 and the functional layer portion 40 (the organic EL display panel 30 and the support layer portion 50), and the axis of the columnar body is arranged in parallel with a bending axis direction of the organic EL display device 100a. Note that in FIG. 9, the outline of the surface S contacting the first spacers 45b (the second spacers 55b) is indicated by a chain double-dashed line for illustrating the direction of bending the organic EL display device 100a. In addition, as illustrated in FIG. 10, each first spacer 45c (each second spacer 55c) is formed as a discoid columnar body on one surface S of the organic EL display panel 30 and the functional layer portion 40 (the organic EL display panel 30 and the support layer portion 50), and is movable (slidable) on the other surface S of the organic EL display panel 30 and the functional layer portion 40 (the organic EL display panel 30 and the support layer portion 50). Note that as illustrated in FIG. 10, each first spacer 45c (each second spacer 55c) is provided in a state in which a bottom surface of the columnar body stands, in a fixed manner, on one surface S of the organic EL display panel 30 and the functional layer portion 40 (the organic EL display panel 30 and the support layer portion 50).

The seal member 60 is, for example, made of silicone resin, urethane resin, or elastomer resin, and exhibits flexibility. Thus, sliding operation among the organic EL display panel 30, the functional layer portion 40, and the support layer portion 50 is allowed.

The organic EL display device 100a having the above-described configuration is configured as follows: the first TFT 13a is, at each sub-pixel P, brought into an ON state by input of a gate signal to the first TFT 13a through the gate line 11; a predetermined voltage corresponding to a source signal is written in the gate electrode of the second TFT 13b and the capacitor 13c through the source line 12a; the light emission layer 3 emits light in such a manner that the level of current from the power source line 12b is defined based on the gate voltage of the second TFT 13b and the defined current is supplied to the light emission layer 3; and image displaying is performed using various types of light emitted from the organic EL display panel 30 toward the functional layer portion 40 (the upper side as viewed in FIG. 4). Note that in the organic EL display device 100a, even when the first TFT 13a is brought into an OFF state, the gate voltage of the second TFT 13b is held by the capacitor 13c, and therefore, light emission from the light emission layer 3 is maintained until a gate signal of a subsequent frame is input.

Moreover, the organic EL display device 100a is configured such that the functional layer portion 40 and the support layer portion 50 are slidably provided on both surfaces of the organic EL display panel 30. Thus, upon bending, the organic EL display panel 30, the functional layer portion 40, and the support layer portion 50 each have the first neutral surface Na, a second neutral surface Nb, a third neutral surface Nc independent from each other, as illustrated in FIG. 2. That is, the first neutral surface Na of the organic EL display panel 30, the second neutral surface Nb of the functional layer portion 40, and the third neutral surface Nc of the support layer portion 50 do not influence each other. In this embodiment, the second neutral surface Nb is a surface which receives no compression and tension and at which no bending stress is substantially caused when the functional layer portion 40 is bent. Moreover, the third neutral surface Nc is a surface which receives no compression and tension and at which no bending stress is substantially caused when the support layer portion 50 is bent. Note that the above-described phrasing of "slidably" means that the relative positions of two adjacent components (e.g., the organic EL display panel 30 and the functional layer portion 40 or the organic EL display panel 30 and the support layer portion 50) facing each other can be changed without the need for physically providing stress to each other. On the other hand, in a case where two adjacent components facing each other are bonded together across the entire surfaces as in a typical multilayer body, when an attempt is made of change relative positions, these components physically provide stress to each other.

The organic EL display device 100a can be manufactured using the following method.

First, the organic EL element layer 20 is, using a well-known method, formed on the front surface of the base resin substrate layer 10 formed on a glass substrate, for example. After the second adhesive layer 21 and the opposing resin substrate layer 22 have been stacked on the organic EL element layer 20, the first adhesive layer 9 and the stress adjustment layer 8 are formed on the back surface of the base resin substrate layer 10 from which the glass substrate has been detached, and in this manner, the organic EL display panel 30 is produced.

Subsequently, the third adhesive layer 32, the touch panel 33, the fourth adhesive layer 34, and the hard coating layer 35 are stacked on the surface of the polarization plate 31 by means of a well-known method, and in this manner, the functional layer portion 40 is produced.

Further, after the second spacers 55 has been dispersed on the surface of the support layer portion 50 and the organic EL display panel 30 has been arranged on the second spacers 55, the first spacers 45 are dispersed on the organic EL display panel 30, and the functional layer portion 40 is arranged on the first spacers 45. Then, each peripheral end portion of the organic EL display panel 30 on the support layer portion 50 and the functional layer portion 40 is caulked with the seal member 60.

As described above, according to the organic EL display device 100a of the present embodiment, the following advantageous effects can be obtained.

(1) The first spacers 45 movable on at least one surface of the organic EL display panel 30 and the functional layer portion 40 are provided between the organic EL display panel 30 and the functional layer portion 40 integrated by the seal member 60 exhibiting the flexibility. Thus, the functional layer portion 40 on one surface side of the organic EL display panel 30 is slidable on one surface of the organic EL display panel 30. Moreover, the second spacers 55 movable on at least one surface of the organic EL display panel 30 and the support layer portion 50 are provided between the organic EL display panel 30 and the support layer portion 50 integrated by the seal member 60 exhibiting the flexibility. Thus, the support layer portion 50 on the other surface side of the organic EL display panel 30 is slidable on the other surface of the organic EL display panel 30. With this configuration, the organic EL display panel 30, the functional layer portion 40, and the support layer portion 50 are mechanically separated from each other, and each have the independent first neutral surface Na, second neutral surface Nb, and third neutral surface Nc. Thus, even when the organic EL display panel 30, the functional layer portion 40, and the support layer portion 50 are stacked on each other, film rupturing and irreversible deformation at each layer of the organic EL display device 100a can be reduced.

(2) The organic EL display panel 30, the functional layer portion 40, and the support layer portion 50 are integrated by the seal member 60 provided at the peripheral end portions of the organic EL display panel 30, the functional layer portion 40, and the support layer portion 50. Thus, in the organic EL display device 100a, in a case where it is found that any one or two of the organic EL display panel 30, the functional layer portion 40, and the support layer portion 50 are defective products, the seal member 60 is formed again after the seal member 60 has been removed to replace the defective products, and in this manner, the organic EL display device 100a can be reworked.

Second Embodiment

Figure 11:
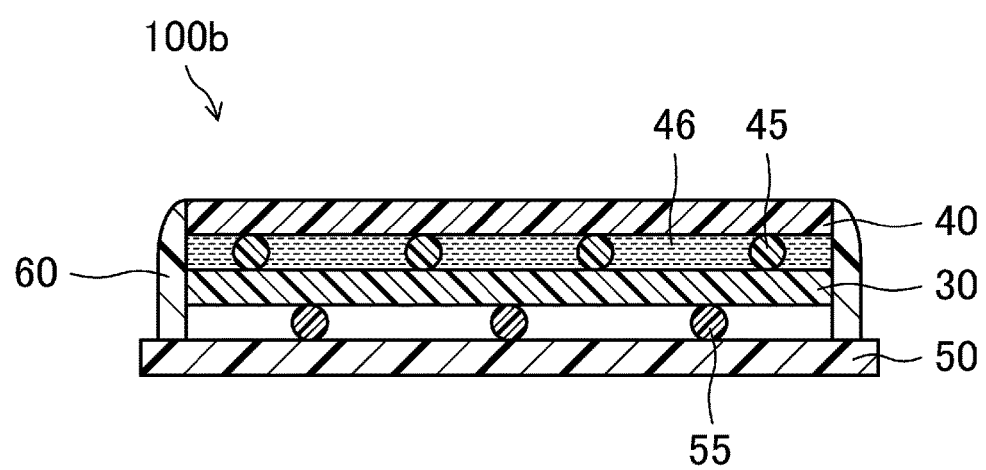
FIG. 11 is a sectional view of an outline configuration of an organic EL display device according to a second embodiment of the present invention.
Figure 12:
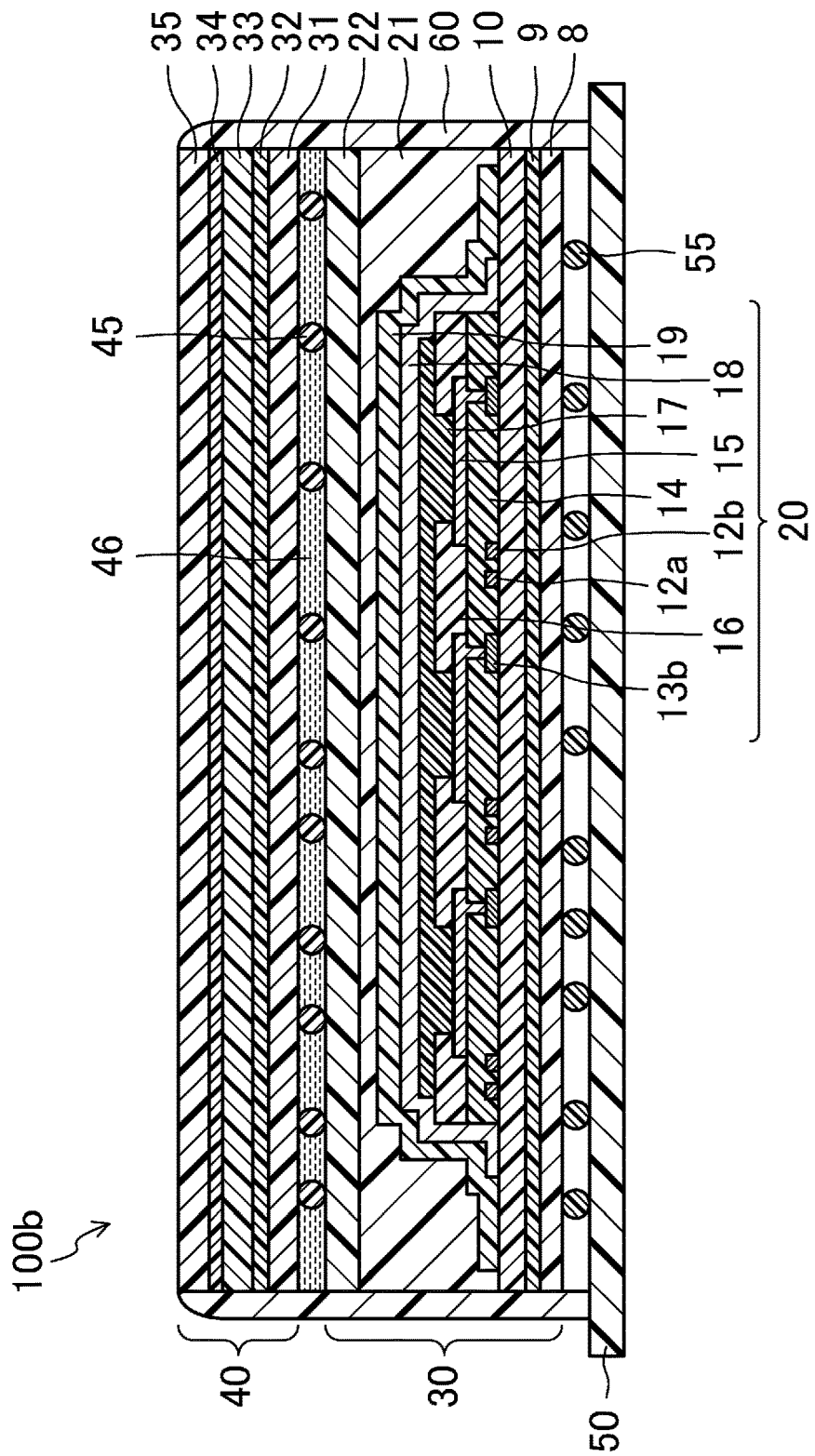
FIG. 12 is a sectional view of a detailed configuration of the organic EL display device according to the second embodiment of the present invention.
Figure 13:
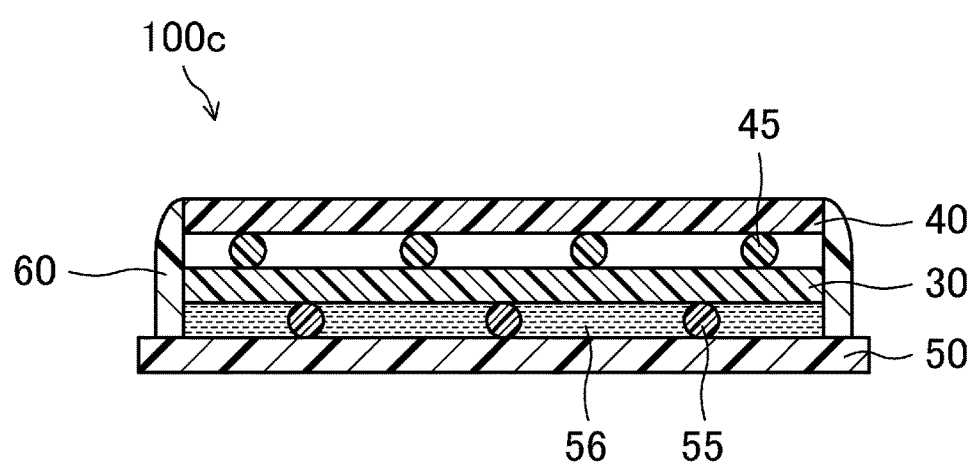
FIG. 13 is a sectional view of an outline configuration of a variation of the organic EL display device according to the second embodiment of the present invention.

FIGS. 11 to 13 illustrate a second embodiment of an organic EL display device according to the present invention. In this embodiment, FIG. 11 is a sectional view of an outline configuration of an organic EL display device 100b of the present embodiment. Moreover, FIG. 12 is a sectional view of a detailed configuration of the organic EL display device 100b. Further, FIG. 13 is a sectional view of an outline configuration of an organic EL display device 100c as a variation of the organic EL display device 100b. Note that in each embodiment below, the same reference numerals are used to represent elements equivalent to those of FIGS. 1 to 10, and detailed description thereof will not be repeated.

In the above-described first embodiment, the organic EL display device 100a configured such that only spacers are provided between the organic EL display panel and each of the functional layer portion and the support layer portion has been described by way of example. However, in the present embodiment, the organic EL display device 100b configured such that spacers and transparent liquid are provided between an organic EL display panel and each of a functional layer portion and a support layer portion has been described by way of example.

As illustrated in FIGS. 11 and 12, the organic EL display device 100b includes the organic EL display panel 30, the functional layer portion 40, and the support layer portion 50 provided to face each other, and has such a structure that the organic EL display panel 30, the functional layer portion 40, and the support layer portion 50 are integrated by a frame-shaped seal member 60 provided at each peripheral end portion of the organic EL display panel 30, the functional layer portion 40, and the support layer portion 50. Note that the structure of pixels arrayed in a display region of the organic EL display device 100b is substantially the same as the structure of the pixels arrayed in the display region of the organic EL display device 100a of the above-described first embodiment.

Multiple first spacers 45 are randomly provided between the organic EL display panel 30 and the functional layer portion 40, and a region surrounded by the seal member 60 between the organic EL display panel 30 and the functional layer portion 40 is filled with the transparent liquid 46. Note that the transparent liquid 46 is sealed between the organic EL display panel 30 and the functional layer portion 40 by a frame-shaped seal material provided inside the seal member 60.

For example, the transparent liquid 46 is made of silicone oil etc. In this embodiment, the refractive index of the transparent liquid 46 is substantially the same as that of the first spacer 45. Note that the substantially same refractive index means that a refractive index difference is within 0.1. Moreover, the refractive index of the transparent liquid 46 and the refractive index of the first spacer 45 are, e.g., 1.57, and are between the refractive index (e.g., 1.45) of a surface layer (a polarization plate 31) of the functional layer portion 40 on a side closer to the organic EL display panel 30 and the refractive index (e.g., 1.67) of a surface layer (an opposing resin substrate layer 22) of the organic EL display panel 30 on a side close to the functional layer portion 40.

The organic EL display device 100b having the above-described configuration is, as in the organic EL display device 100a of the above-described first embodiment, configured such that image displaying is performed in such a manner that light is, as necessary, emitted from a light emission layer 3 at each sub-pixel P.

Moreover, the organic EL display device 100b is configured such that the functional layer portion 40 and the support layer portion 50 are slidably provided on both surfaces of the organic EL display panel 30. Thus, upon bending, the organic EL display panel 30, the functional layer portion 40, and the support layer portion 50 each have independent neutral surfaces (the first neutral surface Na, the second neutral surface Nb, and the third neutral surface Nc of the above-describe d first embodiment).

Further, the organic EL display device 100b can be manufactured in such a manner that in the method for manufacturing the organic EL display device 100a of the above-described first embodiment, changes such as formation of the frame-shaped seal material on the surface of the organic EL display panel 30 before the first spacers 45 are dispersed and dropping of the transparent liquid 46 onto the inside of the seal material are made.

Note that in the present embodiment, the organic EL display device 100b configured such that the space between the organic EL display panel 30 and the functional layer portion 40 is filled with the transparent liquid 46 has been described by way of example. However, as illustrated in FIG. 13, the organic EL display device 100c configured such that a space between an organic EL display panel 30 and a support layer portion 50 is filled with transparent liquid 56 may be employed. Alternatively, an organic EL display device configured such that a space between an organic EL display panel 30 and a functional layer portion 40 is filled with transparent liquid 46 and a space between the organic EL display panel 30 and a support layer portion 50 is filled with transparent liquid 56 may be employed. In this embodiment, the transparent liquid 56 is made of silicone oil etc., for example.

As described above, according to the organic EL display devices 100b, 100c of the present embodiment, the above-described advantageous effects (1) and (2) and the following advantageous effects can be obtained.

(3) In the organic EL display device 100b of the present embodiment, the refractive index of the transparent liquid 46 is the same as that of the first spacer 45. This can suppress light emitted from the organic EL display panel 30 toward the functional layer portion 40 from scattering at the first spacers 45, and therefore, the displaying quality of the organic EL display device 100b can be improved.

(4) In the organic EL display device 100b of the present embodiment, the refractive index of the transparent liquid 46 and the refractive index of the first spacer 45 are between the refractive index of the polarization plate 31 and the refractive index of the opposing resin substrate layer 22. Thus, the light emitted from the organic EL display panel 30 can be taken out toward the functional layer portion 40 with favorable efficiency.

(5) In the organic EL display device 100c of the present embodiment, the space between the organic EL display panel 30 and the support layer portion 50 is filled with the transparent liquid 56, and therefore, heat generated at the organic EL display panel 30 can be released toward the support layer portion 50 with favorable efficiency.

Third Embodiment

Figure 14:
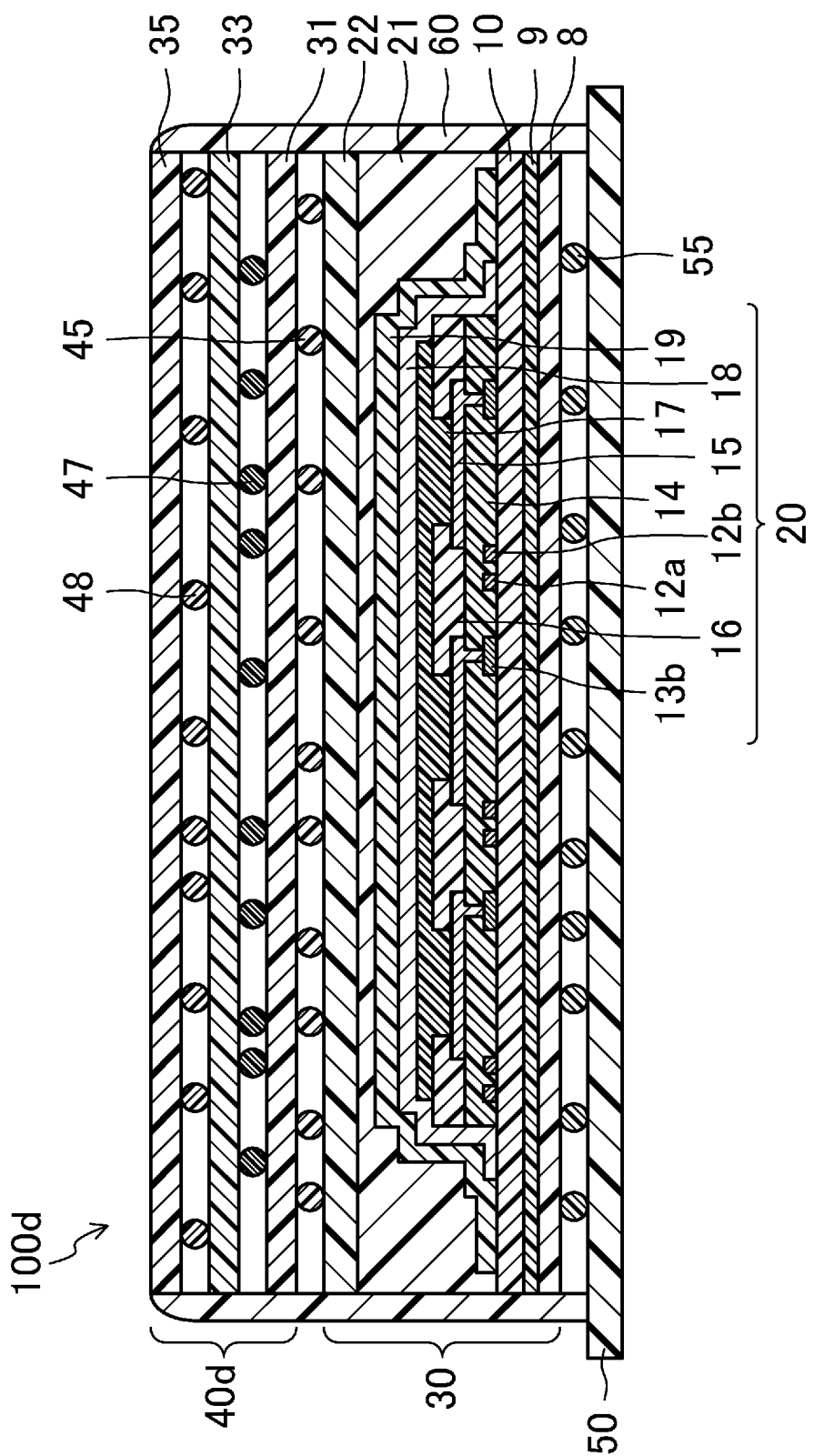
FIG. 14 is a sectional view of a detailed configuration of an organic EL display device according to a third embodiment of the present invention.

FIG. 14 illustrates a third embodiment of an organic EL display device according to the present invention. In this embodiment, FIG. 14 is a sectional view of a detailed configuration of an organic EL display device 100d of the present embodiment.

In the above-described first and second embodiments, the organic EL display devices 100a, 100b (100c) configured such that the polarization plate, the touch panel, and the hard coating layer are bonded to each other have been described by way of example. However, in the present embodiment, the organic EL display device 100d configured such that spacers are arranged between adjacent ones of a polarization plate, a touch panel, and a hard coating layer will be described by way of example.

As illustrated in FIG. 14, the organic EL display device 100d includes an organic EL display panel 30, a functional layer portion 40d, and a support layer portion 50 provided to face each other, and has such a structure that the organic EL display panel 30, the functional layer portion 40d, and the support layer portion 50 are integrated by a frame-shaped seal member 60 provided at each peripheral end portion of the organic EL display panel 30, the functional layer portion 40d, and the support layer portion 50. Note that the structure of pixels arrayed in a display region of the organic EL display device 100d is substantially the same as the structure of the pixels arrayed in the display region of the organic EL display device 100a of the above-described first embodiment.

As illustrated in FIG. 14, the functional layer portion 40d is slidably provided on one surface (the upper side as viewed in the figure) of the organic EL display panel 30 by first spacers 45. Moreover, as illustrated in FIG. 14, the functional layer portion 40d includes the polarization plate 31, the touch panel 33, and the hard coating layer 35 provided as multiple functional layers facing each other, and has such a structure that the polarization plate 31, the touch panel 33, and the hard coating layer 35 are integrated by the frame-shaped seal member 60 provided at each peripheral end portion of the polarization plate 31, the touch panel 33, and the hard coating layer 35. In this embodiment, multiple third spacers 47 movable on each surface of the polarization plate 31 and the touch panel 33 are randomly provided between the polarization plate 31 and the touch panel 33. Moreover, multiple fourth spacers 48 movable on each surface of the touch panel 33 and the hard coating layer 35 are randomly provided between the touch panel 33 and the hard coating layer 35.

The third spacers 47 and the fourth spacers 48 are, for example, formed from Micropearl (registered trademark) series plastic beads manufactured by Sekisui Chemical Co., Ltd. and having a diameter of about 5 μm. Note that in the present embodiment, the spherical third spacer 47 and the spherical fourth spacer 48 have been described by way of example. However, the third spacer 47 and the fourth spacer 48 may be in the shapes of the first spacers 45a to 45c (the second spacers 55a to 55c) described by way of example in the above-described first embodiment.

The organic EL display device 100d having the above-described configuration is, as in the organic EL display device 100a of the above-described first embodiment, configured such that image displaying is performed in such a manner that light is, as necessary, emitted from a light emission layer 3 at each sub-pixel P.

Moreover, the organic EL display device 100d is configured such that the functional layer portion 40 and the support layer portion 50 are slidably provided on both surfaces of the organic EL display panel 30. Thus, upon bending, the organic EL display panel 30, the functional layer portion 40, and the support layer portion 50 each have independent neutral surfaces. Further, the organic EL display device 100d is configured such that the polarization plate 31 and the hard coating layer 35 are slidably provided on both surfaces of the touch panel 33 in the functional layer portion 40d. Thus, upon bending, the polarization plate 31, the touch panel 33, and the hard coating layer 35 each have independent neutral surfaces.

Further, the organic EL display device 100d can be manufactured in such a manner that in the method for manufacturing the organic EL display device 100a of the above-described first embodiment, steps are changed as follows without production of the functional layer portion 40.

The first spacers 45 are dispersed on the surface of the organic EL display panel 30 arranged on the support layer portion 50 through the second spacers 55, and the polarization plate 31 is arranged on the first spacers 45. The third spacers 47 are dispersed on the surface of the polarization plate 31, and the touch panel 33 is arranged on the third spacers 47. The fourth spacers 48 are dispersed on the surface of the touch panel 33, and the hard coating layer 35 is arranged on the fourth spacers 48. Further, each peripheral end portion of the organic EL display panel 30 on the support layer portion 50, the polarization plate 31, the touch panel 33, and the hard coating layer 35 are caulked with the seal member 60.

As described above, according to the organic EL display device 100d of the present embodiment, the above-described advantageous effects (1) and (2) and the following advantageous effects can be obtained.

(1) will be described in detail. The first spacers 45 movable on at least one surface of the organic EL display panel 30 and the functional layer portion 40d are provided between the organic EL display panel 30 and the functional layer portion 40d integrated by the seal member 60 exhibiting flexibility. Thus, the functional layer portion 40d on one surface side of the organic EL display panel 30 is slidable on one surface of the organic EL display panel 30. Moreover, the second spacers 55 movable on at least one surface of the organic EL display panel 30 and the support layer portion 50 are provided between the organic EL display panel 30 and the support layer portion 50 integrated by the seal member 60 exhibiting the flexibility. Thus, the support layer portion 50 on the other surface side of the organic EL display panel 30 is slidable on the other surface of the organic EL display panel 30. With this configuration, the organic EL display panel 30, the functional layer portion 40d, and the support layer portion 50 are mechanically separated from each other, and each have the independent neutral surfaces. Thus, even when the organic EL display panel 30, the functional layer portion 40d, and the support layer portion 50 are stacked on each other, film rupturing and irreversible deformation at each layer of the organic EL display device 100d can be reduced.

(2) will be described in detail. The organic EL display panel 30, the functional layer portion 40d, and the support layer portion 50 are integrated by the seal member 60 provided at the peripheral end portions of the organic EL display panel 30, the functional layer portion 40d, and the support layer portion 50. Thus, in the organic EL display device 100d, in a case where it is found that any one or two of the organic EL display panel 30, the functional layer portion 40d, and the support layer portion 50 are defective products, the seal member 60 is formed again after the seal member 60 has been removed to replace the defective products, and in this manner, the organic EL display device 100d can be reworked.

(5) The third spacers 47 movable on at least one surface of the polarization plate 31 and the touch panel 33 are provided between the polarization plate 31 and the touch panel 33 integrated by the seal member 60 exhibiting the flexibility. Thus, the touch panel 33 on one surface side of the polarization plate 31 is slidable on one surface of the polarization plate 31. Moreover, the fourth spacers 48 movable on at least one surface of the touch panel 33 and the hard coating layer 35 are provided between the touch panel 33 and the hard coating layer 35 integrated by the seal member 60 exhibiting the flexibility. Thus, the hard coating layer 35 on one surface side of the touch panel 33 is slidable on one surface of the touch panel 33. With this configuration, the polarization plate 31, the touch panel 33, and the hard coating layer 35 are mechanically separated from each other, and each have the independent neutral surfaces. Thus, film rupturing and irreversible deformation at each layer of the functional layer portion 40d of the organic EL display device 100d can be reduced.

Fourth Embodiment

Figure 15:
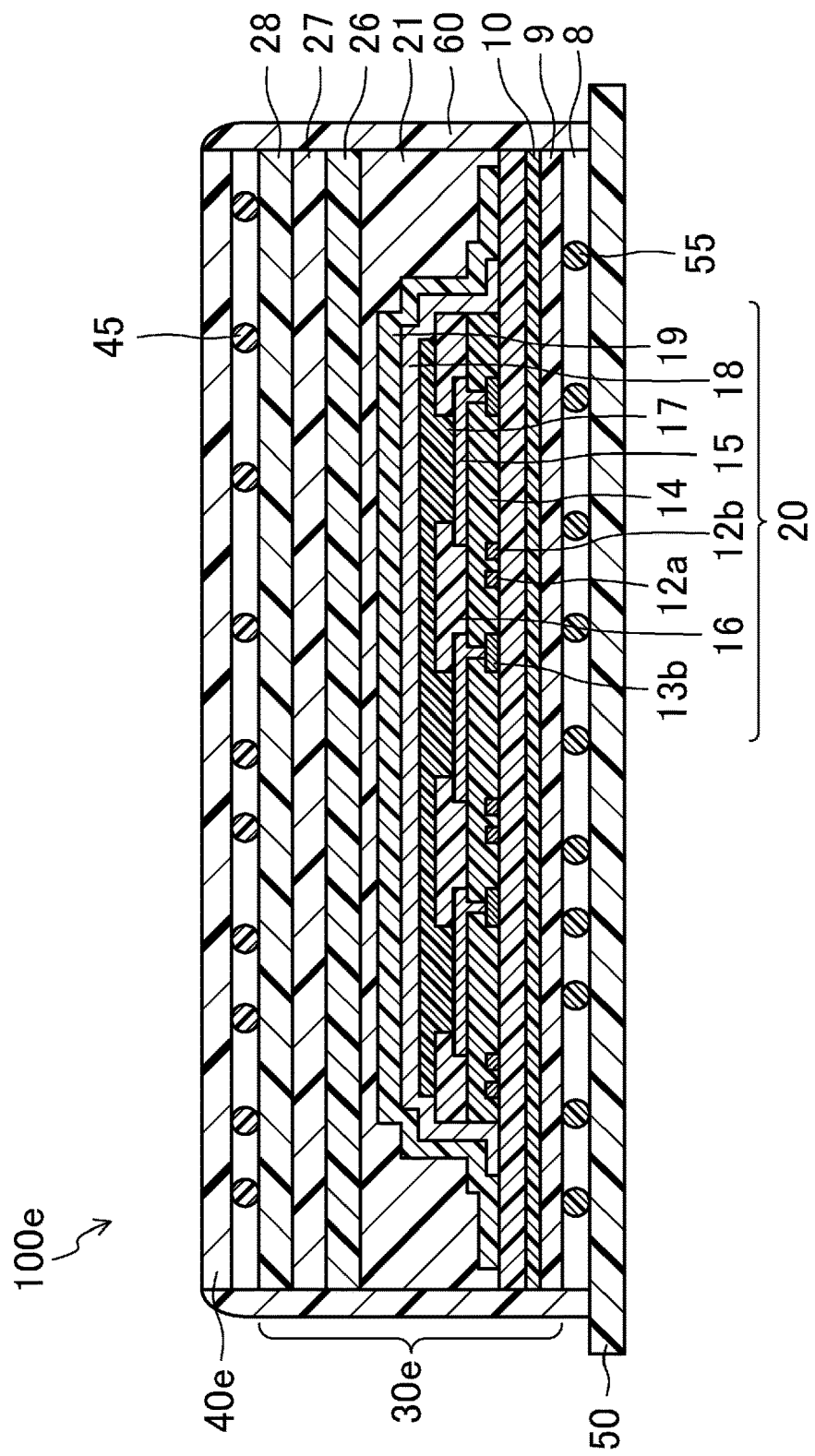
FIG. 15 is a sectional view of a detailed configuration of an organic EL display device according to a fourth embodiment of the present invention.

FIG. 15 illustrates a fourth embodiment of an organic EL display device according to the present invention. In this embodiment, FIG. 15 is a sectional view of a detailed configuration of an organic EL display device 100e of the present embodiment.

In the above-described first to third embodiments, the organic EL display devices 100a to 100d configured such that the touch panel is provided in the functional layer portion have been described by way of example. However, in the present embodiment, the organic EL display device 100e configured such that a touch panel is provided in an organic EL display panel will be described by way of example.

As illustrated in FIG. 15, the organic EL display device 100e includes the organic EL display panel 30e, a functional layer portion 40e, and a support layer portion 50 provided to face each other, and has such a structure that the organic EL display panel 30e, the functional layer portion 40e, and the support layer portion 50 are integrated by a frame-shaped seal member 60 provided at each peripheral end portion of the organic EL display panel 30e, the functional layer portion 40e, and the support layer portion 50. Note that the structure of pixels arrayed in a display region of the organic EL display device 100e is substantially the same as the structure of the pixels arrayed in the display region of the organic EL display device 100a of the above-described first embodiment.

As illustrated in FIG. 15, the organic EL display panel 30e includes a base resin substrate layer 10 provided with a stress adjustment layer 8 on the lower side as viewed in the figure, an organic EL element layer 20 provided on the upper side of the base resin substrate layer 10 as viewed in the figure, and a second adhesive layer 21, a touch panel 26, a color filter 27, and an opposing resin substrate layer 28 stacked in this order on the upper side of the organic EL element layer 20 as viewed in the figure. The organic EL display panel 30e exhibits flexibility.

The touch panel 26 includes, for example, a base film made of polyimide, polyethylene terephthalate, polyethylene naphthalate, aramid, or (meth)acrylate, and a capacitance touch panel layer provided on the base film.

The color filter 27 includes a black matrix layer provided in a grid pattern on the surface (the back surface) of the opposing resin substrate layer 28, multiple color resist layers including red layers, green layers, and blue layers each corresponding to sub-pixels P, and an overcoat layer provided to cover the black matrix layer and each color resist layer.

The opposing resin substrate layer 28 is, for example, formed from a plastic film of polyimide, polyethylene terephthalate, polyethylene naphthalate, aramid, or (meth) acrylate.

The functional layer portion 40e is substantially the same as the hard coating layer 35 of the above-described first embodiment.

The organic EL display device 100e having the above-described configuration is, as in the organic EL display device 100a of the above-described first embodiment, configured such that image displaying is performed in such a manner that light is, as necessary, emitted from a light emission layer 3 at each sub-pixel P.

Moreover, the organic EL display device 100e is configured such that the functional layer portion 40e and the support layer portion 50 are slidably provided on both surfaces of the organic EL display panel 30e. Thus, upon bending, the organic EL display panel 30e, the functional layer portion 40e, and the support layer portion 50 each have independent neutral surfaces.

Further, the organic EL display device 100e can be manufactured in such a manner that in the method for manufacturing the organic EL display device 100a of the above-described first embodiment, steps are changed as follows.

After the opposing resin substrate layer 28 on which the second adhesive layer 21, the touch panel 26, and the color filter 27 are formed in advance has been stacked on the organic EL element layer 20, a first adhesive layer 9 and the stress adjustment layer 8 are formed on the back surface of the base resin substrate layer 10 from which a glass substrate has been detached. In this manner, the organic EL display panel 30e is produced.

Further, the second spacers 55 are dispersed on the surface of the support layer portion 50, and the organic EL display panel 30e is arranged on the second spacers 55. Thereafter, the first spacers 45 are dispersed on the surface of the organic EL display panel 30e, and the functional layer portion 40e is arranged on the first spacers 45. Each peripheral end portion of the organic EL display panel 30e on the support layer portion 50 and the functional layer portion 40e are caulked with the seal member 60.

As described above, according to the organic EL display device 100e of the present embodiment, the above-described advantageous effects (1) and (2) and the following advantageous effects can be obtained.

(1) will be described in detail. The first spacers 45 movable on at least one surface of the organic EL display panel 30e and the functional layer portion 40e are provided between the organic EL display panel 30e and the functional layer portion 40e integrated by the seal member 60 exhibiting flexibility. Thus, the functional layer portion 40e on one surface side of the organic EL display panel 30e is slidable on one surface of the organic EL display panel 30e. Moreover, the second spacers 55 movable on at least one surface of the organic EL display panel 30e and the support layer portion 50 are provided between the organic EL display panel 30e and the support layer portion 50 integrated by the seal member 60 exhibiting the flexibility. Thus, the support layer portion 50 on the other surface side of the organic EL display panel 30e is slidable on the other surface of the organic EL display panel 30e. With this configuration, the organic EL display panel 30e, the functional layer portion 40e, and the support layer portion 50 are mechanically separated from each other, and each have the independent neutral surfaces. Thus, even when the organic EL display panel 30e, the functional layer portion 40e, and the support layer portion 50 are stacked on each other, film rupturing and irreversible deformation at each layer of the organic EL display device 100e can be reduced.

(2) will be described in detail. The organic EL display panel 30e, the functional layer portion 40e, and the support layer portion 50 are integrated by the seal member 60 provided at the peripheral end portions of the organic EL display panel 30e, the functional layer portion 40e, and the support layer portion 50. Thus, in the organic EL display device 100e, in a case where it is found that any one or two of the organic EL display panel 30e, the functional layer portion 40e, and the support layer portion 50 are defective products, the seal member 60 is formed again after the seal member 60 has been removed to replace the defective products, and in this manner, the organic EL display device 100e can be reworked.

(6) The functional layer portion 40e includes only the hard coating layer, and therefore, the neutral surface of the functional layer portion 40e is formed only by the hard coating layer. Thus, even when the functional layer portion 40e (the hard coating layer) is thickened for improving abrasion resistance and pencil hardness of the surface of the organic EL display device 100e, film rupturing at the functional layer portion 40e can be reduced.

Other Embodiments

In each of the above-described embodiments, the organic EL display device including the organic EL display panel has been described by way of example. However, the present invention is also applicable to, e.g., a liquid crystal device including a liquid crystal display panel.

Moreover, in each of the above-described embodiments, the organic EL display device configured such that the spacers (and the transparent liquid) are arranged between the organic EL display panel and each of the functional layer portion and the support layer portion has been described by way of example. However, the present invention is also applicable to an organic EL display device configured such that only transparent liquid is arranged between an organic EL display panel and each of a functional layer portion and a support layer portion and the functional layer portion and the support layer portion are slidable on the organic EL display panel.

Further, in each of the above-described embodiments, the organic EL display devices 100a to 100e have been described by way of example. However, the present invention also is freely applicable to a combination of the multilayer structures of the organic EL display devices 100a to 100e described by way of example.

In addition, in each of the above-described embodiments, the organic EL layer having the five-layer multilayer structure of the electron hole injection layer, the electron hole transport layer, the light emission layer, the electron transport layer, and the electron injection layer has been described by way of example. However, the organic EL layer may have, for example, a three-layer multilayer structure of an electron-hole-injection-plus-electron-hole-transport layer, a light emission layer, and an electron-transport-plus-electron-injection layer.

Moreover, in each of the above-described embodiments, the organic EL display device configured such that the first electrode is the anode and the second electrode is the cathode has been described by way of example. However, the present invention is also applicable to such an organic EL display device that a multilayer structure of an organic EL layer is inverted such that a first electrode is a cathode and a second electrode is an anode.

Further, in each of the above-described embodiments, the organic EL display device configured such that the electrode of the TFT connected to the first electrode is the drain electrode has been described by way of example. However, the present invention is also applicable to an organic EL display device configured such that an electrode of a TFT connected to a first electrode is called a source electrode.

INDUSTRIAL APPLICABILITY

As described above, the present invention is useful for a flexible organic EL display device.

DESCRIPTION OF REFERENCE CHARACTERS 30, 30e Organic EL Display Panel
31 Polarization Plate (Functional Layer)
33 Touch Panel (Functional Layer)
35 Hard Coating Layer (Functional Layer)
40, 40d, 40e Functional Layer Portion
45, 45a to 45c First Spacer
46, 56 Transparent Liquid
47 Third Spacer (Other Spacers)
48 Fourth Spacer (Other Spacers)
50 Support Layer Portion
55, 55a to 55c Second Spacer
60 Seal Member
100a to 100e Organic El Display Device

The invention claimed is:

1. An organic electroluminescence (EL) display device comprising:
    an organic EL display panel exhibiting flexibility;
    a functional layer portion provided to face the organic EL display panel on one surface side thereof and exhibiting flexibility; and
    a support layer portion provided to face the organic EL display panel on the other surface side thereof and exhibiting flexibility, wherein
    the organic EL display panel, the functional layer portion, and the support layer portion are integrated by a seal member provided at a peripheral end portion of the organic EL display panel,
    the functional layer portion, the support layer portion, and the seal member exhibit flexibility,
    the functional layer portion is slidably provided on one surface of the organic EL display panel in a state in which a peripheral end portion of the functional layer portion and the peripheral end portion of the organic EL display panel are fixed by the seal member, and
    the support layer portion is slidably provided on the other surface of the organic EL display panel in a state in which a peripheral portion of the support layer portion and the peripheral end portion of the organic EL display panel are fixed by the seal member.

2. The organic EL display device according to claim 1, wherein
    a first spacer movable on at least one surface of the organic EL display panel and the functional layer portion is provided between the organic EL display panel and the functional layer portion, and
    a second spacer movable on at least one surface of the organic EL display panel and the support layer portion is provided between the organic EL display panel and the support layer portion.

3. The organic EL display device according to claim 2, wherein a space surrounded by the organic EL display panel, the functional layer portion, and the seal member is filled with a transparent liquid.

4. The organic EL display device according to claim 3, wherein a refractive index of the transparent liquid is identical to that of the first spacer.

5. The organic EL display device according to claim 3, wherein the refractive index of the transparent liquid and the refractive index of the first spacer are between a refractive index of a surface layer of the functional layer portion on an organic EL display panel side and a refractive index of a surface layer of the organic EL display panel on a functional layer portion side.

6. The organic EL display device according to claim 2, wherein at least one of the first spacer or the second spacer is defined as a columnar body, and an axis of the columnar body is arranged in parallel with a bending axis direction for bending the organic EL display panel, the functional layer portion, and the support layer portion.

7. The organic EL display device according to claim 2, wherein at least one of the first spacer or the second spacer is defined as a columnar body, and is provided in a state in which a bottom surface of the columnar body stands, in a fixed manner, on corresponding surfaces of the organic EL display panel, the functional layer portion, and the support layer portion.

8. The organic EL display device according to claim 1, wherein the functional layer portion includes at least one of a polarization plate, a touch panel, and a hard coating layer.

9. The organic EL display device according to claim 1, wherein
the functional layer portion includes multiple functional layers provided to face each other, and
among the multiple functional layers, a pair of adjacent functional layers are slidably provided on each other.

10. The organic EL display device according to claim 9, wherein
other spacers movable on at least one of a pair of surfaces facing each other between the pair of functional layers are provided between the pair of functional layers, and
the multiple functional layers are, together with the organic EL display panel and the support layer portion, integrated by a seal member provided at each peripheral end portion of the multiple functional layers and exhibiting flexibility.

11. The organic EL display device according to claim 10, wherein the other spacers are defined as columnar bodies, and an axis of each columnar body is arranged in parallel with a bending axis direction for bending the multiple functional layers.

12. The organic EL display device according to claim 10, wherein the other spacers are defined as columnar bodies, and each spacer is provided in a state in which a bottom surface of the columnar body stands, in a fixed manner, on corresponding surfaces of the multiple functional layers.

13. The organic EL display device according to claim 9, wherein the multiple functional layers are a polarization plate, a touch panel, and a hard coating layer provided in this order from the organic EL display panel side.

14. The organic EL display device according to claim 2, wherein a space surrounded by the organic EL display panel, the support layer portion, and the seal member is filled with a transparent liquid.

15. The organic EL display device according to claim 1, wherein
the seal member is frame-shaped, and
an outer frame of the seal member is larger than an outer edge of the organic EL display panel and an outer edge of the functional support layer portion, and smaller than an outer edge of the support layer portion.

* * * * *